(12) United States Patent
Chen et al.

(10) Patent No.: US 9,831,140 B2
(45) Date of Patent: Nov. 28, 2017

(54) WAFER HAVING PAD STRUCTURE (71) Applicant: TAIWAN SEMICONDUCTOR MANUFACTURING COMPANY, LTD., Hsinchu (TW)

(72) Inventors: Ying-Ju Chen, Tuku Township (TW); Hsien-Wei Chen, Sinying (TW); Hao-Yi Tsai, Hsinchu (TW); Mirng-Ji Lii, Sinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/798,857

(22) Filed: Jul. 14, 2015

(65) Prior Publication Data
US 2015/0318225 A1 Nov. 5, 2015

Related U.S. Application Data (62) Division of application No. 12/984,669, filed on Jan. 5, 2011, now Pat. No. 9,093,411.

(Continued)

(51) Int. Cl.
| | |
|---|---|
| *H01L 21/66* | (2006.01) |
| *H01L 23/50* | (2006.01) |
| *H01L 23/522* | (2006.01) |
| *H01L 23/528* | (2006.01) |
| *H01L 23/532* | (2006.01) |

(Continued)

(52) U.S. Cl.
CPC ............ *H01L 22/34* (2013.01); *H01L 22/32* (2013.01); *H01L 23/50* (2013.01); *H01L 23/5226* (2013.01); *H01L 23/5283* (2013.01); *H01L 23/5383* (2013.01); *H01L 23/53209* (2013.01); *H01L 23/53214* (2013.01); *H01L 23/53228* (2013.01); *H01L 24/05* (2013.01); *H01L 29/0649* (2013.01); *H01L 2224/02166* (2013.01); *H01L 2224/05093* (2013.01); *H01L 2924/01013* (2013.01);

(Continued)

(58) Field of Classification Search
CPC ... H01L 22/32; H01L 21/76807; H01L 22/34; H01L 23/5226; H01L 23/562
See application file for complete search history.

(56) References Cited

U.S. PATENT DOCUMENTS

| | | |
|---|---|---|
| 5,665,655 A | 9/1997 | White |
| 5,702,982 A | 12/1997 | Lee et al. |

(Continued)

*Primary Examiner* — Kenneth Parker
*Assistant Examiner* — Fang-Xing Jiang
(74) *Attorney, Agent, or Firm* — Hauptman Ham, LLP (57) ABSTRACT

A wafer including a substrate having a plurality of integrated circuits formed above the substrate, and at least one scribe line between two of the integrated circuits. The wafer further includes a plurality of dielectric layers formed in the at least one scribe line having a process control monitor (PCM) pad structure formed therein, the PCM pad structure having: a plurality of metal pads interconnected by a plurality of conductive vias. The PCM pad further includes a plurality of contact bars in contact with a bottom-most metal pad, the contact bars extending substantially vertically from the bottom-most metal pad into the substrate. Additionally, the PCM pad includes an isolation structure substantially surrounding the plurality of contact bars to isolate the PCM pad structure.

20 Claims, 6 Drawing Sheets

Related U.S. Application Data (60) Provisional application No. 61/394,477, filed on Oct. 19, 2010.

(51) Int. Cl.
*H01L 29/06* (2006.01)
*H01L 23/538* (2006.01)
*H01L 23/00* (2006.01)

(52) U.S. Cl.
CPC ............... *H01L 2924/01029* (2013.01); *H01L 2924/01074* (2013.01); *H01L 2924/14* (2013.01)

(56) References Cited

U.S. PATENT DOCUMENTS

| | | | |
|---|---|---|---|
| 6,174,775 B1* | 1/2001 | Liaw | H01L 21/823835 257/369 |
| 6,495,918 B1* | 12/2002 | Brintzinger | H01L 23/562 257/692 |
| 6,870,265 B2* | 3/2005 | Kurimoto | H01L 21/76807 257/758 |
| 7,335,577 B2 | 2/2008 | Daubenspeck et al. | |
| 7,642,650 B2 | 1/2010 | Sugiura et al. | |
| 8,742,594 B2 | 6/2014 | Daubenspeck et al. | |
| 8,810,001 B2 | 8/2014 | Hung et al. | |
| 2003/0230809 A1* | 12/2003 | Nakajima | H01L 23/5226 257/758 |
| 2006/0012012 A1 | 1/2006 | Wang et al. | |
| 2006/0022195 A1* | 2/2006 | Wang | H01L 22/32 257/48 |
| 2008/0042292 A1 | 2/2008 | Adkisson et al. | |
| 2009/0032929 A1 | 2/2009 | Daubenspeck et al. | |
| 2009/0121321 A1 | 5/2009 | Miccoli et al. | |
| 2010/0123135 A1 | 5/2010 | Chen | |
| 2010/0123219 A1 | 5/2010 | Chen et al. | |
| 2010/0314619 A1* | 12/2010 | Kaltalioglu | H01L 22/34 257/48 |
| 2011/0272790 A1 | 11/2011 | Choi et al. | |
| 2011/0287627 A1 | 11/2011 | Chen et al. | |

* cited by examiner

WAFER HAVING PAD STRUCTURE

PRIORITY CLAIM

The present application is a divisional of U.S. application Ser. No. 12/984,669, filed Jan. 5, 2011, which claims priority of U.S. Provisional Application Ser. No. 61/394,477, filed on Oct. 19, 2010, which are incorporated herein by reference in their entireties.

FIELD

The disclosure relates generally to semiconductor devices and fabrication techniques and, more particularly, to interconnect structures and test methods.

BACKGROUND

In order to achieve high-integration and high-speed, dimensions of semiconductor integrated circuits have been reduced, and various materials and techniques have been proposed and used during fabrication. For example, dual damascene technology and copper conductors are applied to reduce resistances and resistance-capacitance (RC) delay of interconnect structures in integrated circuits (ICs). As ICs are made smaller, and the distance between adjacent lines is reduced, low dielectric constant (low-k) dielectric materials are used in advanced copper interconnect technology to reduce these delays.

Interconnect structures of a semiconductor IC connect the various active devices and circuits of the IC to a plurality of conductive pads on the top surface of the die. Multi-level interconnect structures have been developed that accommodate the advances in active-device density by more effectively routing conductive paths between the active devices and the surface of the die. In typical IC designs, five or more individual interconnect levels of conductive paths may be used to accommodate the active-device density. Multi-level interconnect structures comprise metallization lines arranged in multiple layers (or levels). The metallization lines of each individual level are formed in an interlevel dielectric (ILD) material. The ILD electrically isolates the metallization lines from one another within each level of the interconnect structures and electrically isolates metallization lines in adjacent levels.

Damascene processes are routinely used in back-end-of-line (BEOL) processing for fabricating multi-level interconnect structures. In a damascene process, trenches and vias are etched in a layer of ILD and filled with a conductive material, such as copper (Cu) or a Cu-based alloy, to create conductive lines and vertical conductive paths between the interconnect lines in different levels.

The conductive paths of the multi-level interconnect structures terminate in bond pads at the surface of the IC. The bond pads are relatively large metal areas distributed throughout at least a top surface of the die. Bond pads are used to establish electrical contact between the integrated circuits and either a package substrate of an IC package or a probe pin (that is used for wafer acceptance testing, or WAT). The pads used during WAT are also referred to as, "process control monitor (PCM) pads." A probe makes an electrical contact between a probe pin and the bond pads, so voltage or current can be applied to the IC for testing device functionality and performance. The bond pads that are used for WAT may be distributed in the scribe lines between dies. These scribe lines are severed during the die singulation process, with the cuts passing through the bond pads.

A conventional approach for configuring the WAT bond pads on the interconnect structure is to include bond pads in the scribe line on each interconnect layer, aligned beneath the bond pads in scribe line of the top metal layer, and to include metal-filled vias connecting the bond pads in each of the interconnect levels, aligned beneath each bonding pad or probe pad in the top metal layer. The bond pads in the first interconnect (M1) layer may be used for in situ testing before the second (M2) through top metal (MT) layers are formed.

The dicing (or singulation) process can produce a large mechanical stress, which may be dependent on numerous conditions, including: cut width, die saw speed, die saw temperature, die saw pressure, etc.

Conventional multi-level interconnect structures have been susceptible to failure due to cracking when the PCM pad is cut by a die saw. Experience has shown that during singulation, the dielectric in the scribe lines may crack in the vicinity of the bond pads, and that these cracks may propagate to the dies. This problem becomes more acute when low-k dielectric materials (including extreme low-k, ELK and ultra low-k, ULK) are used for the ILD material, because low-k dielectric materials are more brittle than high-k dielectrics.

BRIEF DESCRIPTION OF DRAWINGS

The features, aspects, and advantages of the disclosure will become more fully apparent from the following detailed description, appended claims, and accompanying drawings in which:

FIG. 1b is a perspective view of the PCM pad structure of FIG. 1a.

FIG. 2b is a perspective view of the PCM pad structure of FIG. 2a.

FIG. 3b is a perspective view of the PCM pad structure of FIG. 3a.

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

In semiconductor products where low-K dielectric materials are used, cracking has been observed when the PCM pad is cut. The cracking mechanism is complex, but experiences have shown that it is strongly related to the brittle dielectric materials used in the ILD layer when the die saw blade moves across the PCM pad in the scribe lines of the wafer during singulation. When the die saw blade contacts the metal structure of the PCM pads, the probability of crack formation is increased.

To increase IC reliability and reduce the likelihood of cracking to the dies when the PCM pad is cut by a die saw, the PCM pad structure needs to be reinforced. In some embodiments, the reinforcement of a PCM pad is accomplished by forming a plurality of contact bars. The contact bars contact the first metal layer M1 of the PCM pad structure and are embedded into the substrate (as shown in FIG. 1c) to serve as pillars to reduce the likelihood of the PCM pad structure from peeling off during a die saw process.

Figure 1A:
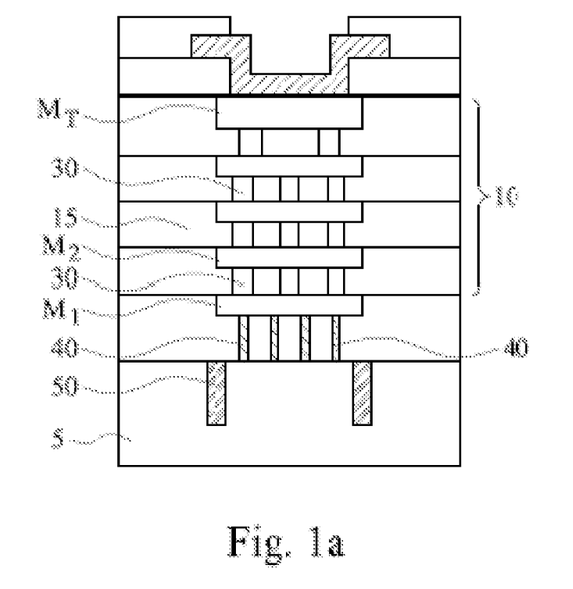
FIG. 1a is a cross sectional view of a portion of a PCM pad structure in a scribe line of a semiconductor wafer, according to a first embodiment.
Figure 1B:
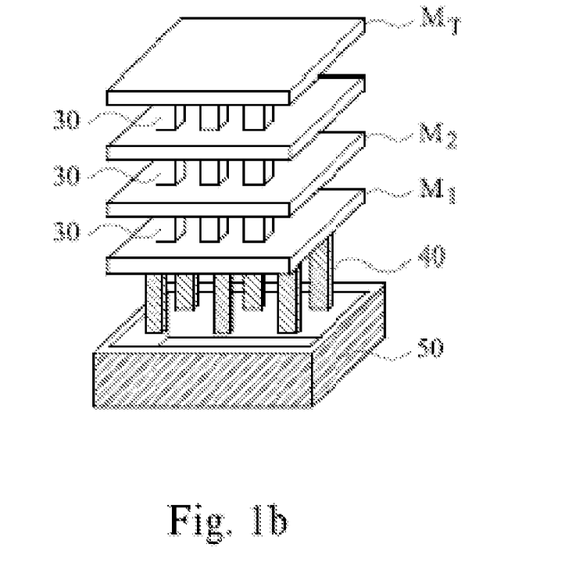
Figure 1C:
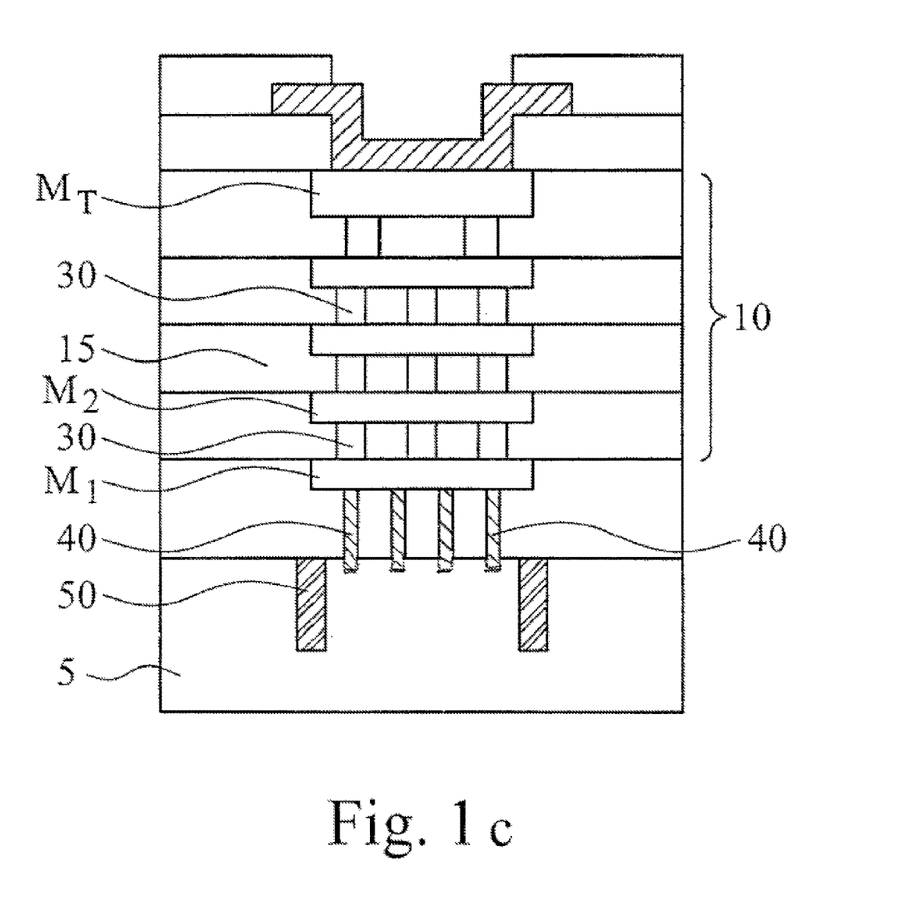
FIG. 1c is a cross sectional view of a portion of a PCM pad structure in a scribe line of a semiconductor wafer, according to at least one embodiment.

FIG. 1a depicts a cross-sectional portion of an exemplary PCM pad structure 10 having contact bars 40 and an isolation structure 50 formed in a substrate 5, according to a first embodiment. FIG. 1b is a perspective view of the PCM pad structure of FIG. 1a. The PCM pad structure 10 may be formed on a portion of the process wafer where a multi-level integrated circuit semiconductor device is formed or on a portion where no electrical devices are formed nearby. For example, the PCM pad structure 10 is first formed with a lower (first) metal layer M1 (e.g., copper or copper alloys), formed in a dielectric insulating layer 15. Conventional processes may be carried out to form metal layer M1 including patterning, etching trench openings in the insulating layer 15, forming barrier layers to line the openings, filling the openings with metal, and carrying out a planarization process, e.g., a CMP process, to planarize the metal filled damascene.

Following the planarization step, an overlying metal layer M2 is formed including conductive vias 30 in electrical communication with metal layer M1. It will be appreciated that metal layer M2 and conductive vias 30 may be formed separately or by a dual damascene process.

The PCM pad structure 10 of FIG. 1a also includes a plurality of contact bars 40 in electrical contact with metal layer M1 and extending substantially vertically from metal layer M1 into the substrate 5. Contact bars 40 serve as the pillars for PCM pad structure 10 by reducing the likelihood of the PCM pad structure 10 from peeling off during a singulation process and hence cracks from forming and propagating to the dies. Contact bars 40 may be formed prior to the formation of the first metal layer M1 and formed by a single or dual damascene process. Contact bars 40 may be formed of a material such as tungsten, copper, copper alloys, or aluminum. Other conductive materials are also contemplated. It will be appreciated that the number, shape, widths and/or lengths of the contact bars 40 may each or all be varied. However, the number, shape, widths, and/or lengths of the contact bars depend on the amount of support needed to reinforce the PCM pad structure 10 and prevent the PCM pad structure from peeling off during a die saw process and causing cracks to form and propagate to the dies.

Between any two adjacent PCM pad structures 10 that have contact bars 40, there may be current leakage that may influence the electrical test accuracy of the test pattern or lead to other undesirable electrical effects. To prevent current leakage from one PCM pad structure to another PCM pad structure or other devices in the wafer, an isolation structure 50 is formed around the contact bars 40, thereby isolating the PCM pad structure. FIG. 1a shows the isolation structure 50 as having substantially a square or rectangular shape. It will be appreciated, however that the shape of the isolation structure 50 is not limited to the example in FIGS. 1a and 1b but that the shape, along with the widths, lengths, and/or thickness of the isolation structure 50 may each or all be varied. For example, isolation structure 50 may have a circular shape.

In at least one embodiment, the isolation structure 50 comprises oxide and has a thickness D from about 500 Angstroms (Å) to about 2,500 Å. Preferably, the isolation structure 50 has a thickness sufficient for electrical isolation between devices in the wafer. In at least one embodiment, the isolation structure 50 has a thickness from about 500 Å to about 1,000 Å. In some embodiments the isolation structure 50 may be a shallow trench isolation (STI) region and comprising oxide. Other isolation materials are also contemplated. The STI region may be formed by the steps of trench etch, oxide fill, and oxide polish. In some other embodiments, the isolation structure may be a field oxide (FOX) layer comprising oxide and having a thick layer of oxide between 2,500 Å to 15,000 Å thick to prevent the migration of electrical charge.

Figure 2A:
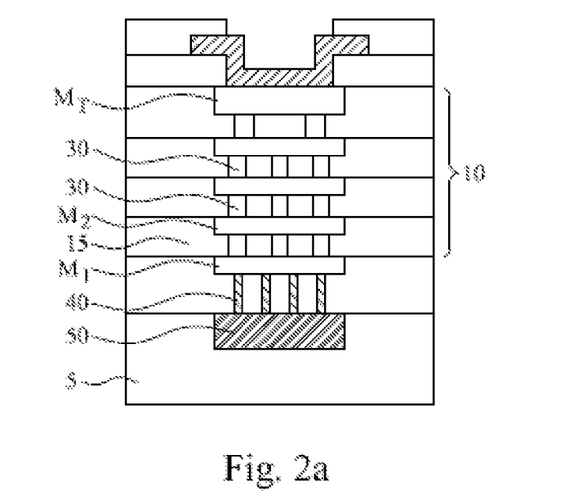
FIG. 2a is a cross sectional view of a portion of a PCM pad structure in a scribe line of a semiconductor wafer, according to a second embodiment.
Figure 2B:
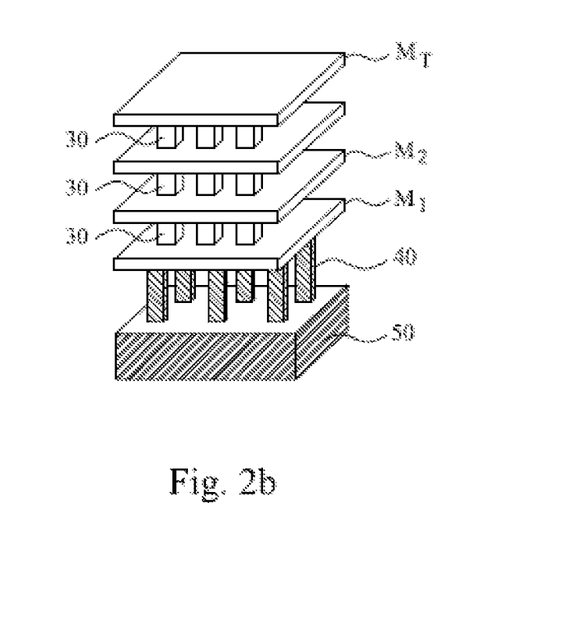
Figure 2C:
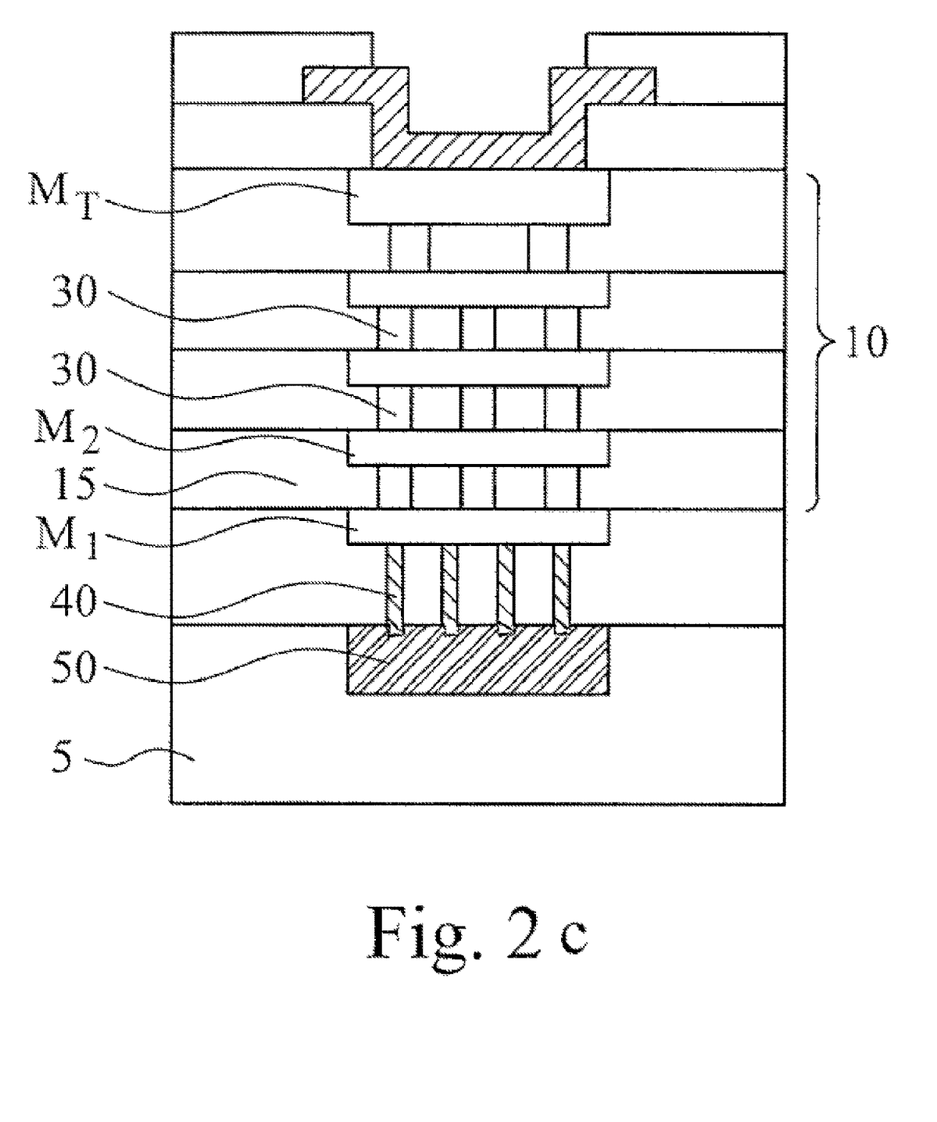
FIG. 2c is a cross sectional view of a portion of a PCM pad structure in a scribe line of a semiconductor wafer, according to at least one embodiment.

In another embodiment as depicted in FIGS. 2a and 2b, the isolation structure 50 electrically contacts the plurality of contact bars 40, thereby isolating the PCM pad structure 10 from other devices in the wafer. In some embodiments, the plurality of contact bars 40 extends substantially into the isolation structure 50 (as shown in FIG. 2c).

Figure 3A:
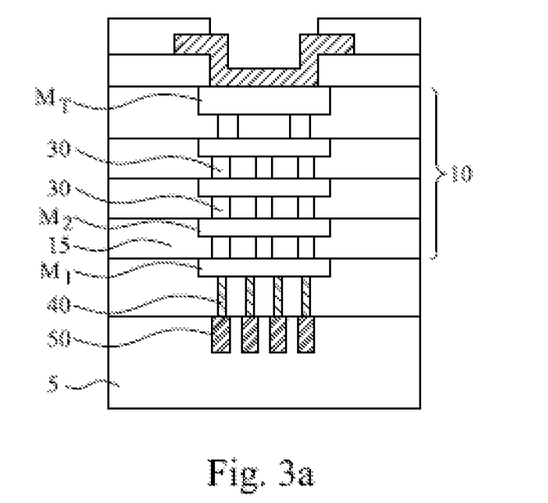
FIG. 3a is a cross sectional view of a portion of a PCM pad structure in a scribe line of a semiconductor wafer, according to a third embodiment.
Figure 3B:
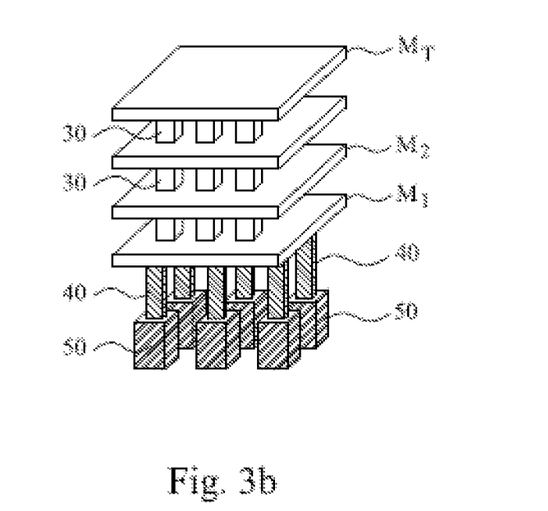
Figure 3C:
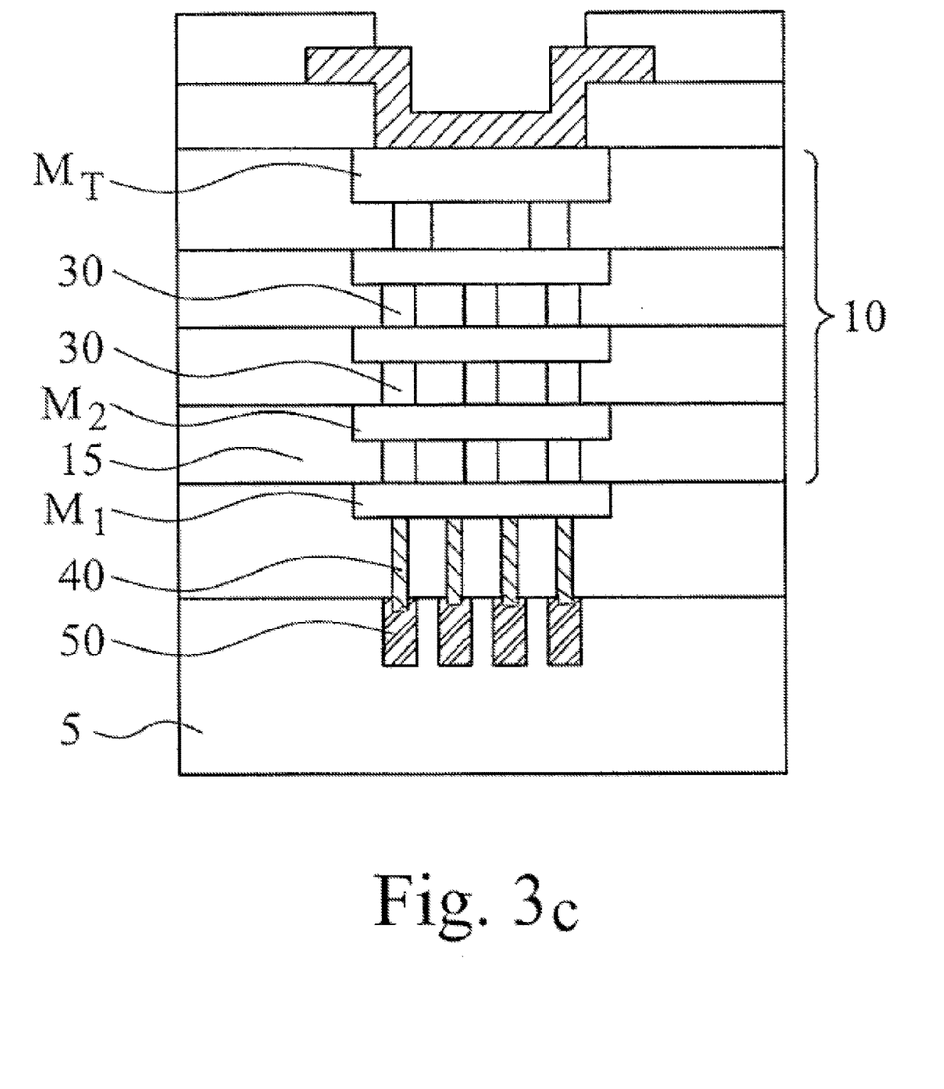
FIG. 3c is a cross sectional view of a portion of a PCM pad structure in a scribe line of a semiconductor wafer, according to at least one embodiment.

In yet another embodiment as depicted in FIGS. 3a and 3b, each of the plurality of isolation structures 50 is connected to one of the plurality of contact bars 40 to isolate the PCM pad structure from other devices. In other embodiments, each of the plurality of isolation structures 50 substantially surrounds one end of the corresponding one of the plurality of contact bars 40. In some embodiments, the plurality of contact bars 40 extends substantially into the corresponding isolation structures 50 (as shown in FIG. 3c).

Embodiments of the PCM pad structures have now been described. The PCM pad structures have the advantages of increasing the IC reliability during testing by reducing the likelihood of cracks from forming and propagating to the dies during a die saw process and isolating the PCM pad structures from other devices in the wafer from electrical charge leakage.

One aspect of the present application relates to a wafer including a substrate having a plurality of integrated circuits formed above the substrate, and at least one scribe line between two of the integrated circuits. The wafer further includes a plurality of dielectric layers formed in the at least one scribe line having a process control monitor (PCM) pad structure formed therein, the PCM pad structure having: a plurality of metal pads interconnected by a plurality of conductive vias. The PCM pad further includes a plurality of contact bars in contact with a bottom-most metal pad, the contact bars extending substantially vertically from the bottom-most metal pad into the substrate. Additionally, the PCM pad includes an isolation structure substantially surrounding the plurality of contact bars to isolate the PCM pad structure.

Another aspect of the present application relates to a PCM pad structure for carrying out integrated circuit testing and failure analysis including at least two metal pads connected there-between by a plurality of conductive vias. The PCM pad further includes a plurality of contact bars in contact with a bottom-most metal pad, the contact bars extending substantially vertically from the bottom-most metal pad into the substrate. Additionally, the PCM pad structure includes an isolation structure substantially surrounding the plurality of contact bars to isolate the PCM pad structure.

Still another aspect of the present application relates to a wafer including at least two metal pads connected there-between by a plurality of vias. The wafer further includes a plurality of contact bars in contact with a bottom-most metal pad of the at least two metal pads, wherein each contact bar of the plurality of contact bars extends vertically from the bottom-most metal pad into a substrate. Additionally, the wafer includes an isolation structure embedded in the substrate, wherein a bottom surface of at least one contact bar of the plurality of contact bars is coplanar with a top surface of the isolation.

In the preceding detailed description, the present invention is described with reference to specifically exemplary embodiments thereof. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:

1. A wafer comprising:
   a substrate having a plurality of integrated circuits formed above the substrate, and at least one scribe line between two of the integrated circuits; and
   a plurality of dielectric layers formed in the at least one scribe line having a process control monitor (PCM) pad structure formed therein, the PCM pad structure having:
      a plurality of metal pads interconnected by a plurality of conductive vias;
      a plurality of contact bars in contact with a bottom-most metal pad, the contact bars extending substantially vertically from the bottom-most metal pad to an area of the substrate; and
      a single isolation structure substantially surrounding the plurality of contact bars to isolate the PCM pad structure, the single isolation structure encircles the area of the substrate, and the area of the substrate is free of functional circuitry.

2. The wafer of claim 1, wherein the isolation structure is a shallow trench isolation (STI) region or a field oxide layer.

3. The wafer of claim 1, wherein the isolation structure comprises oxide.

4. The wafer of claim 1, wherein each contact bar of the plurality of contact bars comprises tungsten, copper, copper alloys, aluminum, or a combination thereof.

5. The wafer of claim 1, wherein a bottom surface of at least one contact bar of the plurality of contact bars is coplanar with a top surface of the isolation structure.

6. The wafer of claim 1, wherein the plurality of contact bars in contact with the bottom-most metal pad comprises at least five contact bars in contact with the bottom-most metal pad.

7. A PCM pad structure for carrying out integrated circuit testing and failure analysis, comprising:
   at least two metal pads connected there-between by a plurality of conductive vias;
   a plurality of contact bars in contact with a bottom-most metal pad, the contact bars extending substantially vertically from the bottom-most metal pad to the substrate; and
   an isolation structure substantially surrounding the plurality of contact bars to isolate the PCM pad structure, wherein a structure thickness of the isolation structure ranges from 2,500 angstroms (Å) to 15,000 Å, wherein an area of the substrate encircled by the isolation structure is free of functional circuitry.

8. The PCM pad structure of claim 7, wherein the isolation structure is an STI region or a field oxide layer.

9. The PCM pad structure of claim 7, wherein the isolation structure comprises oxide.

10. The PCM pad structure of claim 7, wherein each contact bar of the plurality of contact bars comprises tungsten, copper, copper alloys, aluminum, or a combination thereof.

11. The PCM pad structure of claim 7, wherein a bottom surface of at least one contact bar of the plurality of contact bars is coplanar with a top surface of the isolation.

12. The PCM pad structure of claim 7, wherein the plurality of contact bars in contact with the bottom-most metal pad comprises at least five contact bars in contact with the bottom-most metal pad.

13. The PCM pad structure of claim 7, wherein the isolation structure is a single isolation structure.

14. A wafer comprising:
   a plurality of dies;
   at least two metal pads connected there-between by a plurality of vias;
   a plurality of contact bars in contact with a bottom-most metal pad of the at least two metal pads, wherein each contact bar of the plurality of contact bars extends vertically from the bottom-most metal pad to a substrate, and the plurality of contact bars contact an area of the substrate; and
   an isolation structure embedded in the substrate, wherein a bottom surface of at least one contact bar of the plurality of contact bars is coplanar with a top surface of the isolation, wherein a thickness of the isolation structure ranges from 500 angstroms (Å) to 2500 Å, the isolation structure is a single isolation structure encircling the area of the substrate, the isolation structure is between the area of the substrate and a first die of the plurality of dies, the isolation structure is between the area of the substrate and a second die of the plurality of dies, and the first die is adjacent to the second die.

15. The wafer of claim 14, wherein the top surface of the isolation structure is coplanar with an uppermost surface of the substrate.

16. The wafer of claim 14, wherein the isolation structure is an STI region or a field oxide layer.

17. The wafer of claim 14, wherein each contact bar of the plurality of contact bars comprises tungsten, copper, copper alloys, aluminum, or a combination thereof.

18. The wafer of claim 14, wherein the plurality of contact bars in contact with the bottom-most metal pad comprises at least five contact bars in contact with the bottom-most metal pad.

19. The wafer of claim 14, wherein the isolation structure comprises oxide.

20. The wafer of claim 14, wherein a sidewall of the isolation structure extends substantially perpendicular to a top surface of the substrate.

* * * * *